United States Patent [19]

Ryan

[11] 4,453,248

[45] Jun. 5, 1984

[54] FAULT ALIGNMENT EXCLUSION METHOD TO PREVENT REALIGNMENT OF PREVIOUSLY PAIRED MEMORY DEFECTS

[75] Inventor: Philip M. Ryan, Hopewell Junction, N.Y.

[73] Assignee: International Business Machines Corporation, Armonk, N.Y.

[21] Appl. No.: 388,833

[22] Filed: Jun. 16, 1982

[51] Int. Cl.$^3$ .......................................... G06F 11/10
[52] U.S. Cl. ...................................... 371/11; 371/38; 365/200
[58] Field of Search ........................... 371/11, 10, 38; 365/200; 364/200, 900

[56] References Cited

U.S. PATENT DOCUMENTS

| | | | |
|---|---|---|---|
| 3,644,902 | 2/1972 | Beausoleil | 365/200 |
| 3,897,626 | 8/1975 | Beausoleil | 365/200 X |
| 4,291,389 | 9/1981 | Toth | 365/200 |

OTHER PUBLICATIONS

Beausoleil, Maintenance for Memory with Error Correction, IBM Technical Disclosure Bulletin, vol. 11, No. 12, May 1969, pp. 1692-1693.

Chen, Fault Dispersion in Computer Memories, IBM Technical Disclosure Bulletin, vol. 25, No. 11A, Apr. 1983, pp. 5836-5838.

Ryan, Fault Realignment Through Grouping of Compatible Faulty Memory Chips, IBM Tech. Discl. Bulletin, vol. 26, No. 6, Nov. 1983, pp. 2753-2754.

Primary Examiner—Charles E. Atkinson
Attorney, Agent, or Firm—R. E. Cummins

[57] ABSTRACT

A method is disclosed for insuring that two semiconductor chips which have a 1-bit defect at the same chip address are not paired at any memory address by a fault alignment exclusion mechanism (FAEM) which functions to position chips having defects at different memory addresses. The FAEM employs an error map to determine which chips must be realigned in their respective columns and an address permute vector functions to effectively change the physical address of the chip in the column to a logical address. The two permute vectors for the two columns contributing to any uncorrectable error are "exclusive-ORed" and the result stored in a second map along with an identification of the chip columns. Any time in the future that a new permute vector is proposed for assignment to any column of chips, the changed permute vector is exclusive-ORed with the permute vectors currently assigned to all other columns of the memory to see if any such combination produces a result forbidden by the forbidden result table. If no such forbidden result is found, the proposed permute vector can be assigned with the assurance that no pair of chips previously found to produce aligned faults will align now in any row of the memory. If any forbidden result is found, the proposed permute vector is discarded and a new one proposed.

7 Claims, 4 Drawing Figures

| (1) | (2) | | | (3) | | |
|---|---|---|---|---|---|---|
| FORBIDDEN | FIRST PAIRED CHIP | | | SECOND PAIRED CHIP | | |
| "EX OR" | CO# | CHIP# | PERM. VEC. | CO# | CHIP# | PERM. VEC. |
| 01101 | 024 | 10 | 010 10 | 038 | 14 | 00111 |
| ≈ | ≈ | ≈ | ≈ | ≈ | ≈ | ≈ |

FAULT ALIGNMENT EXCLUSION METHOD TO PREVENT REALIGNMENT OF PREVIOUSLY PAIRED MEMORY DEFECTS

DESCRIPTION

BACKGROUND OF THE INVENTION

1. Field of Invention

This invention relates in general to fault tolerant memory systems and, in particular, to an improved method for realigning memory chips within respective memory columns to prevent two chips that were initially the source of a multi-bit error at an address from being aligned at some future time.

2. Cross-Referenced Applications

Application Ser. No. 388,834, filed concurrently herewith and assigned to the assignee of the present invention, describes a fault tolerant memory system in which fault alignment exclusion is provided by (1) data steering logic connected between the memory and the multi-word buffer and/or (2) memory address permutation logic to effectively rearrange the chip addresses in the chip column associated with the defective bit position.

Application Ser. No. 388,830, filed concurrently herewith and assigned to the assignee of the present invention, is directed to a method for storing data in a fault tolerant memory system in which the data portion of the word is stored in either the true or complement form while the check byte portion is always stored in true form to reduce the number of words read from memory that contain more errors than can be corrected by the ECC system.

Application Ser. No. 388,831, filed concurrently herewith and assigned to the assignee of the present invention, is directed to a fault tolerant memory system of the type described in application Ser. No. 388,834 which includes means for transferring the data from each memory chip associated with the memory column which has been detected as containing a defective bit position to other chips in the same column. The data transfer involves addressing the defect column with the old permute address and reading data to a buffer and writing data from the buffer back to the chips in the same column using a new permute address.

Application Ser. No. 388,832, filed concurrently herewith and assigned to the assignee of the present invention, is directed to an arrangement for maintaining an up-to-date map of defective bit positions in the memory during actual use of the memory in its working environment.

3. Description of Prior Art

The desirability of large, fast, inexpensive semiconductor memories is well recognized in the data processing art. Large memories, such as 16 megabyte memories, for example, are generally made up of a number of 64K bit array chips. In one typical arrangement of a 16 megabyte memory, the 64K bit chips are arranged with 128 chips disposed in four 32-chip arrays on one card, with 18 such cards making up the total system. The system is arranged to provide one bit from each 32-chip array in parallel to form a 72-bit data word which includes an 8-bit ECC check character designed to automatically correct a single bit error in any bit position of the 72-bit word by conventional ECC syndrome processing techniques.

A 16 word 72-bit buffer is connected between the central processing unit of the data processing system and the memory system. A store operation involves first, loading the 16 word buffers from the CPU and then transferring the 16 words in parallel to memory in response to a store or write memory command. The memory address involves selecting 16 chips in each 32 chip array and uses 16 bits of the address to select one of 64K storage positions on each of the 16 selected chips.

As is well known, a 64K memory chip does not necessarily have all 64K 1-bit storage positions operative. Since the memory system can tolerate an error in each 72-bit data word that is transferred from memory, considerable cost savings can be achieved by using memory chips which are not necessarily perfect. It is very likely, however, that in the assembly of the various chips into 72 multi-chip arrays on 18 separate cards to form the 16 megabyte memory, the placement of chips with defective storage locations will result in some of the (32×64K) word addresses containing more than one defective bit position. Since, in addition to single bit failures on a chip, complete row and column failures are also possible, resulting in 256 bit storage positions being defective, the chances are that occasionally a memory address will contain more than one defective bit position.

When such a situation occurs, the prior art systems suggest various arrangements to avoid the problem.

One suggestion in the prior art involves merely skipping memory locations which have more than one defective bit location. Another arrangement is disclosed in the cross-referenced copending application Ser. No. 388,834. In that cross-referenced application, data steering logic is provided in each array channel between the multi-chip array and the multi-word buffer register. The logic is responsive to the contents of a failure alignment exclusion register to effect scattering of defective bit positions among different data words or memory positions to minimize the occurrence of more than one defective bit position at any one memory address. To further improve the scattering of defective bit positions in the disclosed system, there is also provided an address permutation logic block for each of the 32 chip arrays which functions to substitute one chip (having a defective bit position) with another associated chip in the same 32-chip array in response to control signals supplied thereto from the associated data processing system.

As discussed in the cross-referenced application, the control signals are developed prior to storage of data in the memory system by a suitable test program which (1) identifies all defective locations in the 16 megabyte memory, and (2) identifies all memory address positions in the memory in which the number of defective bit locations exceeds the corresponding capability of the system error correcting system, i.e., two errors. The control signals are then developed for the steering logic and the address permutation logic in accordance with a suitable algorithm that effectively realigns one of the two defective bit positions to another address where no defective bit positions occur. The complexity of the algorithm will, of course, vary depending on the size of the memory, the width of the data word being transferred between the system and the memory, and the number and types of errors which may occur in each of the 64K memory chips.

In such systems, after the control signals are developed which, in effect, scatter the defective bit positions among the various addresses of the memory so that there is no more than one defective bit position at any one address, it is generally assumed that the realignment of the defective bit positions has been achieved without inadvertently creating more than one defective bit position at a memory address. Unfortunately, most test systems which are designed to detect bit positions which are defective in a memory chip and in a large memory system of many chips cannot, for a number of valid technical reasons, identify each and every single bit error in a large, e.g., 16 megabyte memory. In addition, new permanent errors develop in memory chips after they are put into service and these are not necessarily detected at the time they occur. The task of developing new control signals which eliminate the alignment of two defective bit positions does not guarantee that the new alignment will always result in only one defect per address. It is, therefore, desirable to provide a method which will reduce the possibility of substituting chips having defective bit positions that would result in one memory address having two defective storage locations. Such an arrangement becomes more significant as the memory ages and acquires more defective storage locations since the possibility of successful realignment of defective positions decreases as the number of new defects increases. The system further solves the problem of intermittent type faults which occur in normal operation of the memory under particular pattern dependent circumstances which are not addressed during diagnostic testing, by immediately identifying the particular faulty chips at the time the double error occurs.

Should such a condition occur, it must be assumed that the initial memory test which identifies defective locations in each chip somehow missed one of the locations which now has been identified as being defective. If a new address permute vector is developed in accordance with the basic algorithm to replace the initial vector, the fault alignment algorithm that developed the initial control signals may repeat the error at some future time since the new error is not in the originally developed error map. There is, therefore, a need to prevent the two chips that contributed to the uncorrectable error from ever again being paired at the same address or in the same relationship at some other address. The present invention provides a method to prevent these two chips from being so paired in the future.

SUMMARY OF THE INVENTION

In accordance with the present invention, a table is developed in a memory which lists for each unexpected double error that is detected, the pair of column numbers that are involved in the newly detected double error, along with the results of a linear mathematical operation such as an exclusive-OR operation on the respective control signals or permute vectors. The operation on the respective permute vectors defines a relative relationship of the two chips which will always result in a uncorrectable error, and such relationship is, therefore, forbidden whenever new permute vectors are being developed for these columns. The development of new permute vectors to realign double faults is modified to include a step which compares the results of operating on any proposed new permute vectors in the same manner against the forbidden result list before permanently assigning the newly developed permute vectors to the system. The method of the present invention insures that all memory positions contain no more than one defect at the time the memory is made operational in the system.

It is, therefore, an object of the present invention to provide an improved method for developing control signals for a fault tolerant memory system that controls the alignment of defective bit positions at a memory address.

The foregoing and other objects, features and advantages of the invention will be apparent from the following more particular description of a preferred embodiment of the invention as illustrated in the accompanying drawings.

DESCRIPTION OF THE PREFERRED EMBODIMENT

Figure 1:
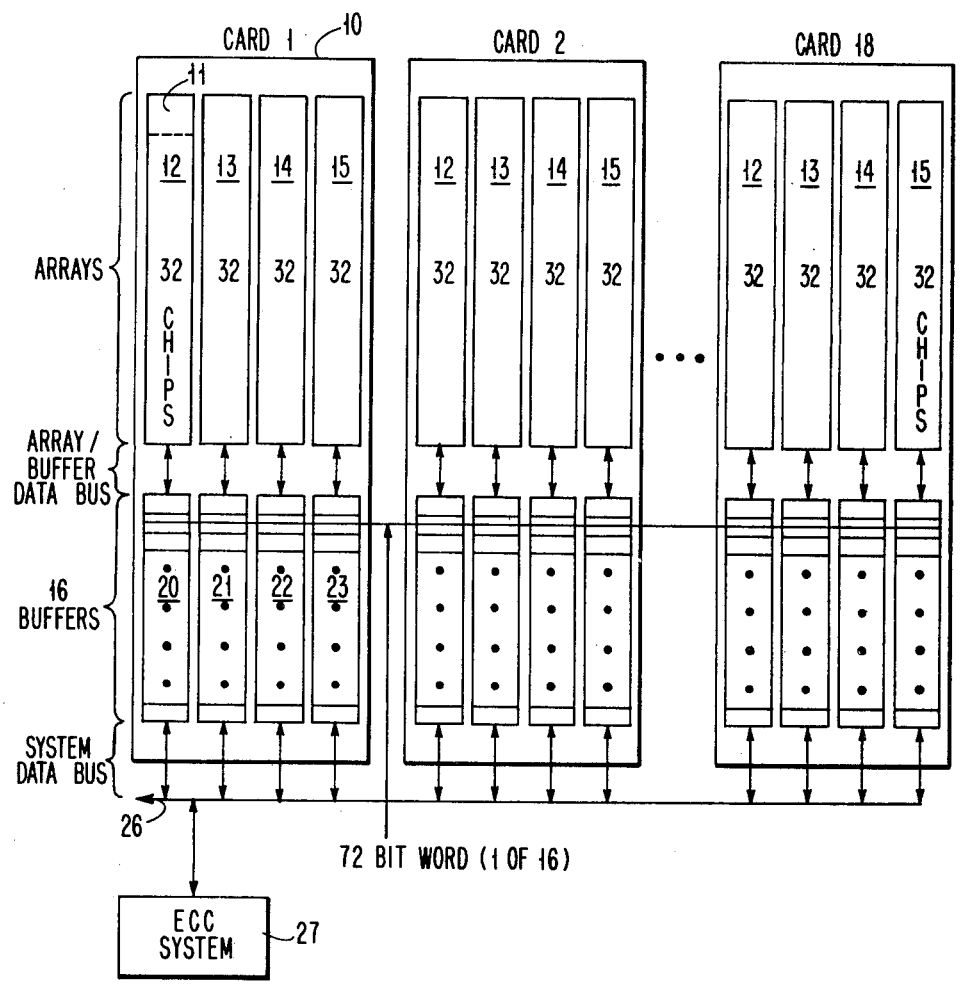
FIG. 1 is a schematic representation of a typical memory system in which the method of the present invention may be employed.

The memory system shown schematically in FIG. 1 represents generally a conventional large-scale semiconductor memory, for example, a 16 megabyte memory. The memory, as shown in FIG. 1, comprises 18 separate memory cards 10. Each of the cards are identical in that the cards are populated with 128 separate 64K memory chips 11 which are arranged on the card 10 in four separate 32-chip arrays 12, 13, 14 and 15. The system is arranged to provide a 72-bit data word so that each of the 72 (4×18) arrays contributes one bit to each data word. The arrays are addressed in parallel, for example, by a 16-bit address, which defines the 1-bit intersection of one of the 256 rows and one of the 256 columns in each of the 32 separate 64K bit chips. The manner in which chips are selected and read out will be discussed later on in the specification.

As shown in FIG. 1, four 16-bit buffers 20-23 are associated respectively with the chip arrays 12-15 on each card. Each buffer 20, 21, 22 and 23 has 16 buffer positions so that 16 72-bit data words are contained in the whole buffer 24. Each buffer position may provide a single bit shared for both input and output, or two bits dedicated to input and to output.

In addition to address signals, each card is also supplied with suitable read, write and control signals along with conventional clock or timing signals (not shown), as is well known in the art.

Figure 2:
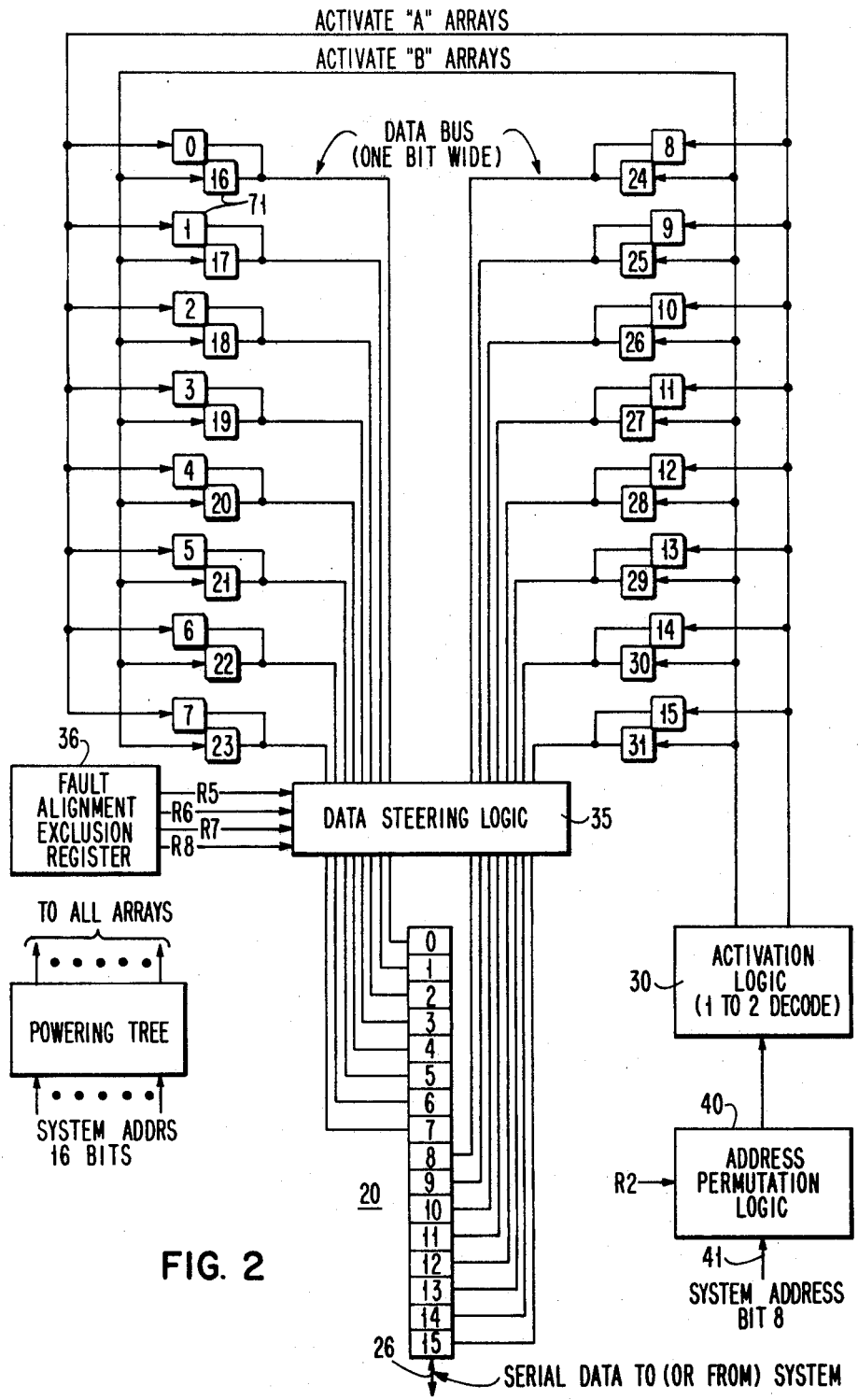
FIG. 2 is a schematic view illustrating one channel of the memory system shown in FIG. 1.

The memory shown in FIG. 1 is also referred to as having 72 separate channels in that one 32-chip array 12 and its associated 16-bit buffer 20 comprise one channel which is shown in detail in FIG. 2.

The buffer is connected to the system data bus 26 to transfer the 16 separate 72-bit words to the system either in serial by bit form or in parallel. It is assumed that a suitable error correcting system 27 (ECC) is provided in the overall arrangement to automatically correct, for example, 1-bit errors in any one bit position of a word. The data word, therefore includes for example a check byte consisting of 8 bit positions.

It will be appreciated by those persons skilled in the art that it is really not economically feasible to provide a 16 megabyte memory in which there are 128×18 error-free 64K bit memory chips which are all perfect and which will remain error-free for the useful life of the memory. The added cost of providing defect-free chips compared to the cost of a simple ECC system for correcting a single bit error has resulted in most memories being provided with an ECC system of reasonable capability and cost. However, as the number of defects permitted in each 64K chip increases, and the capacity of the memory increases, the probability of encountering an address in memory having more than one defective bit position also increases. Rather than eliminate that address from being used by the system, the arrangement shown in FIG. 2 may be employed with considerable advantage in that, with a small addition of some added logic circuitry, previous storage addresses in memory that would have been skipped in accordance with prior art suggestions can now be employed.

FIG. 2 illustrates in detail one channel of the memory shown in FIG. 1 with the additional logic circuitry along with additional details of the memory address permutation logic. FIG. 2 shows the individual chips associated with one 32-chip array. As illustrated, the 32 chips are numbered 0-31 and divided into an A array and a B array which, as will be explained in detail later on, are operated at different clock times based on the output of activate logic 30. As shown, the output of one chip, 0 or 16, of each array A and B is supplied to stage 0 of the buffer register 20 through data steering logic block 35 which is provided with control signals R5-R8 from a fault alignment exclusion register 36. The general function of logic 35 is to alter the normal relationship of chip 0 for example in the A array and chip 16 in the B array with stage 0 of buffer register 20 so that each of the 32 chips may be selectively connected to each of the 16 stages of buffer 20, depending on the binary pattern of control signals R5 through R8.

The arrangement shown in FIG. 2 also includes address permutation logic 40 which is connected between one system address memory line 41 and the activate logic 30 and is supplied with a control signal R2 from the fault alignment exclusion register 36. The function of permute logic 40 is to effectively change or swap the two associated memory chips in the one channel so that, if a given memory address involves a defective bit position in chip 0, for example, the address permutation logic of the channel can be supplied a control signal R2 which causes the other memory chip 16 to be exchanged for chip 0 for that memory address. The objective of steering logic 25 and permutation logic 40 is to limit each memory address to a number of defective bit locations (1) that is equal to or less than the capability of the ECC system so that an uncorrectable error is never encountered by the overall memory system.

The normal operation of the memory is as follows. The 16 word buffers are connected as shown in FIG. 2. All 18 cards are addressed in parallel with the same 16-bit chip address so that a 72-bit data word is transferred out from each chip in the array to the buffer 20 and then to the system bus 26 at one time in response to a read buffer command. Also, 16 data words may be transferred from the system data bus 26 to the buffer 20 in response to a write buffer command. The 16 data words are transferred to memory in parallel in response to a write memory command.

Transfers between the buffer and the memory, whether read or write, are generally similar in that all chips of the array are provided with the same bit address with 16 bits being read out in parallel from the 16 chips associated with the A array in one clock time and the 16 bits being read out of the chips associated with the B array at some subsequent clock time. With the steering logic in its neutral state, that is, all control signals at binary 0. The connective relationships between the chips and the respective stages of the buffer are, as shown in FIG. 2 and described above.

As previously mentioned, application of control signals to the steering logic changes the normal relationships that each chip has with its stage of the buffer.

The control signals are supplied from some suitable source, such as another memory associated with the CPU. The control signals are developed prior to storage of data in the memory system by a suitable test program which (1) identifies all defective storage locations in the 16 megabyte memory, and (2) identifies all memory address positions in the memory in which the number of defective bit locations exceeds the corresponding capability of the system error correcting system 26. Control signals R5-R8 and R2 are then developed for the steering logic and/or the address permutation logic in accordance with a suitable algorithm. The algorithm involves first identifying a memory address that has more than one defect. Next, the algorithm realigns all but one of the defective bit positions to some other address where no defective positions exist. The realignment is achieved by applying control signals to the steering logic or to the permute logic or both. The complexity of the algorithm will, of course, vary depending on the size of the memory, the width of the data word being transferred between the CPU and the memory, and the number and type of errors permitted in each of the 64K memory chips. It is also possible that the algorithm may result in moving both defects from their current address to two different addresses and that, as the memory ages and new defects are mapped, control signals associated with the respective columns may require updating and changing to reflect the new error data.

The function of the steering logic and the permute logic for each column may also be viewed as defining the order in which the 32 chips are arranged in its column on the matrix. If, for example, all control signals R2 and R5-R8 are all 0's, then the chips assume their normal decimal order, namely 0-31, with chip 0 at row 0, etc. If, however, a permute vector of decimal 9, for example, is applied to that column, the chips appear in the following order:

| Chip Number | Chip Position Decimal | Chip Position Binary | Permute Vector Decimal | Permute Vector Binary | Permuted Position |
|---|---|---|---|---|---|
| 0 | 0 | 00000 | 9 | 01001 | 9 |
| 1 | 1 | 00001 | 9 | 01001 | 8 |
| 2 | 2 | 00010 | 9 | 01001 | 11 |
| 3 | 3 | 00011 | 9 | 01001 | 10 |
| 4 | 4 | 00100 | 9 | 01001 | 12 |
| 30 | 30 | 11110 | 9 | 01001 | 23 |
| 31 | 31 | 11111 | 9 | 01001 | 22 |

It will be appreciated that, with 32 chips per column and a 5-bit vector available for rearranging the order of these chips, 32 different orders are available independently in each column. Stated differently, each of the 32 row positions can have any one of the 32 chips assigned to it by appropriate selection of the permute vector to that matrix column.

The algorithm for developing the permute vector relies completely on the error data that is contained in the stored map to insure that when a permute vector is developed for a column, the chip containing the defective bit position is moved to a row position which contains chips that are all defect free at the corresponding bit address.

This is necessary since it will be recalled that the 16-bit address defining a bit position on the chip as the intersection of one 256 rows and one 256 columns and that the 16-bit address is applied to each chip in the matrix. It will, therefore, be recognized that the integrity of the error map is important and various operating strategies for the memory have been developed to keep the map current and to prevent the occurrence of any uncorrectable error when the memory is storing the user's data.

Figures 3, 4:
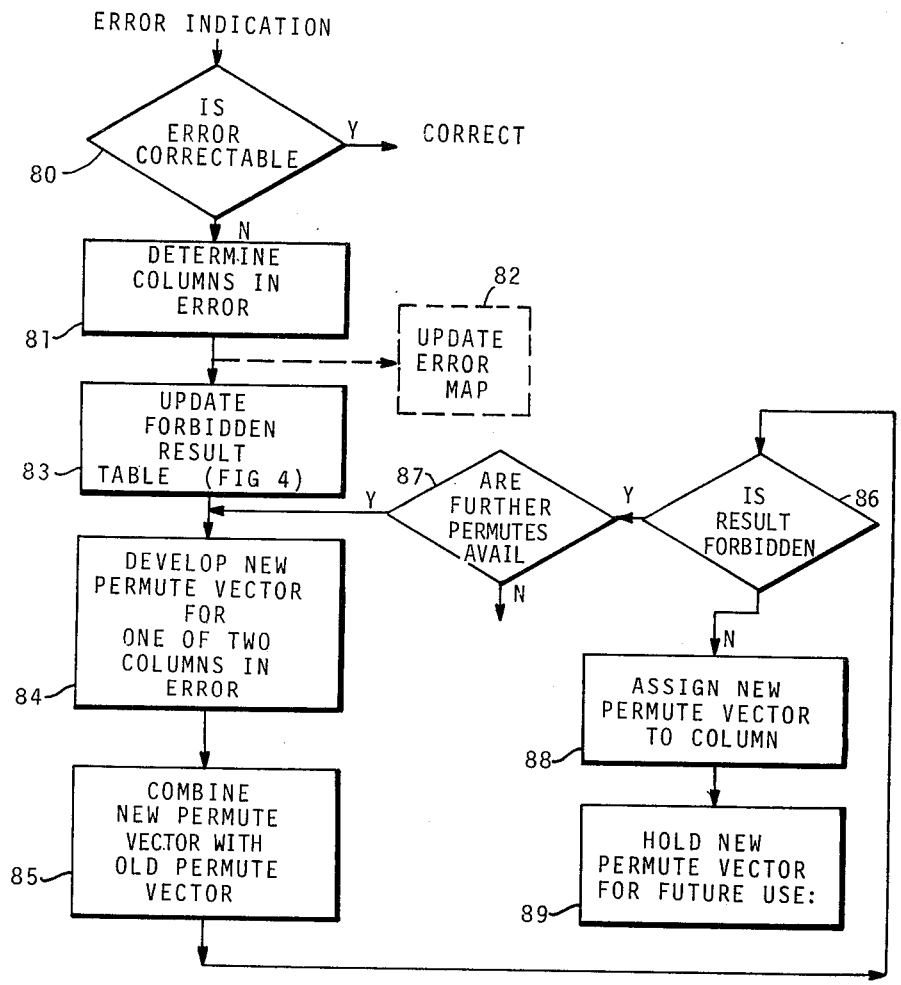
FIG. 3 is a flowchart of the improved method for generating control signals which minimize a new alignment having two defective bit positions in the same memory address.
FIG. 4 illustrates a section of a memory which is used to store data that is involved in certain of the method steps shown in FIG. 3.

The flowchart of FIG. 3 represents a series of steps which should be taken by the system when an unexpected, uncorrectable error has been identified by the error correcting system after all the other previous tests have occurred. The identification of the uncorrectable error may occur during actual use in the field or during a test by the user prior to data being stored in the memory.

It is assumed, as shown by blocks 80 and 81 of FIG. 3, that as part of the process of detecting the uncorrectable error, the column locations of the two chips having defective bit positions that have been aligned has been determined along with the row position which the chips have been assigned by their respective permute vectors. It must be assumed that at least one of the defects which contributed to the error is not in the fault map for some valid reason, or that, even if both defects were recorded the fault map, the permutation algorithm had assigned permute vectors based on a low (but non-zero) probability that an alignment might occur and the unlikely alignment did in fact occur. Depending on the detailed format of the fault map, it may or may not be appropriate to update the fault map to reflect the information newly available on the most recent unexpected error alignment, as shown in box 82 of FIG. 3.

In addition to the update of the error map, a new table is established by the present invention, as represented by block 83, to record in a memory the data which is shown in FIG. 4. The column numbers of the two chips involved in the latest aligned error are recorded along with the exclusive OR of the purmute vectors which applied to them at the time the aligned error was found. The function of the table in FIG. 4 is to insure that pairs of chips whose alignment caused unexpected aligned errors at some time in the past will not be aligned at some future time in some other row by the imposition of new permute vectors. The first and second columns of FIG. 4 identify the two chip columns which supplied erroneous bits in earlier, unexpected error incidents. The corresponding entry in the third column of FIG. 4 represents the result of exclusive-ORing the two permute vectors applied to the two columns of chips at the time that the unexpected alignment occurred. Entries in columns 1 and 2 of FIG. 4 will be numbers in the range 1–72, identifying columns of chips. Entries in column 3 will be 5-bit binary numbers representing the result of exclusive-ORing the permute vectors applied to the two columns supplying bad data at the time the erroneous word was discovered. Each row in FIG. 4 represents a "forbidden result", which forbids any combination of permute vectors to be applied to any pair of chip columns the exclusive-OR of which would produce the forbidden result in the corresponding entry in column 3 of FIG. 4. This constraint prevents any pair of chips which previously caused an error alignment in some row of chips from ever again being aligned together in the same or any other row of chips in the memory.

The process of developing a new permute vector for one of the two columns now in error starts with block 84. Various algorithms may be employed to determine the new permute vector. The choice will generally depend on a compromise between hardware costs and the time available for the selecting process. In the preferred embodiment, a straightforward trial and error approach is employed which is based on selecting one permute vector from a list of all possible permute vectors for the one column. This tentatively selected vector is combined with the permute vectors assigned to the other 71 columns of chips as shown in box 85 of FIG. 3. This tentative combination is then tested against FIG. 4 to determine if the selected vector for the one column is forbidden by any row in FIG. 4. For example, suppose that at some earlier time an alignment was detected involving one chip in col. 24 and one chip in col. 38. The permute vectors assigned at that time to column 24 and column 38 were 00010 and 00111 respectively. When this earlier error was detected, the calculated forbidden combination was 00010⊕00111=00101 as shown in the first row entry in FIG. 4. A new alignment has now occurred involving one chip from column 24 and one chip from column 31. As a result of other actions taken in the interval between the two detected errors, the permute vectors now assigned to columns 24, 31 and 38 are 00011, 01001, and 00101, respectively. The second row entry shown in FIG. 4 reflects the new forbidden result associated with the latest alignment, added by the operation of box 83 in FIG. 3.

Column 24 and column 31 are the two columns involved in the latest aligned error. Assume column 24 is to be assigned a new permute vector. The most straightforward method of developing it is to test each of the 32 possible assignments of its vector, until one is found that does not produce a forbidden result. An assignment of 00000 to column 24 is rejected because 00000 exclusive-ORed with 00101, the vector still assigned to column 38, produces 00101 which is forbidden by the first row of FIG. 4. This rejection takes place in box 86 of FIG. 3. Box 87 determines that other permute vector assignments are available for column 24 and box 84 then tries 00001. 00001 is tested against the first entry of FIG. 4: 00001 excluxive-ORed with 00101, the vector currently assigned to column 38, produces 00100, which is allowed; moving to the second row of FIG. 4, 00001 excluxive-ORed with 01001, the vector currently assigned to column 31, produces 01000, which is allowed. Therefore assigning 00001 to column 24 produces no forbidden result and box 88 makes this assignment, which is held until some convenient time to be loaded into the hardware data steering logic.

In general, each possible permute vector assignable to one of the two columns involved in the most recent error is tested to find one which avoids all forbidden results. If none is found, block 87 detects that condition and notifies the system that some future action is required. In practice, permute vectors would be proposed for both columns containing the errors. The specific action that occurs when all proposed permute vectors are exhausted is left to the system and could involve manual or automatic reconfiguration of the memory cards.

If block 86 indicates that the exclusive-OR result of block 85 is not forbidden, the new permute vector is assigned to the column in accordance with block 88. The system holds the new vector, as shown in block 89, until some convenient time when the new permute vector can be loaded into the appropriate fault alignment exclusion register (FIG. 2, box 36).

It can be shown that by exclusive-ORing the two permute vectors, the result represents an absolute relationship between the two chips which is independent of their row position in the column. Stated differently, if the two paired chips are initially placed in row 4 of the matrix by their respective permute vectors, the result of exclusive-ORing of these permute vectors will be identical to the result of exclusive-ORing the respective permute vectors for the same two chips when they are paired at any other row in the matrix.

The above permute vector relationship tests represented by blocks 85 and 86 of FIG. 4 may be incorporated into the basic algorithm for assigning permute vectors that is employed prior to the memory being put online. Alternately, when the online operation of the memory is temporarily halted because an uncorrectable error is indicated, the development of a new permute vector for one column which satisfies the above relationship test may be achieved with a minimum interruption. However, before the system is returned to normal operation, the data in the column having the new permute vector should be rearranged in accordance with the teachings of the cross-referenced copending application Ser. No. 388,831.

While only two lines of the table in FIG. 4 are completed with data, it should be recognized that the table is never erased until a card in the memory is changed. The table will, therefore, be accumulated for the life of the memory and its importance becomes more significant as the number of errors develop and the chance of having two previously paired chips that resulted in an uncorrectable error being paired increases.

It should be remembered that the identity of an uncorrectable error only concerns defects at the one memory address. The defective bit position may be an isolated defect at that one bit position. It could also be that the entire chip is defective or that the defect is one of 256 associated defects in either an entire row or an entire column of a chip. The result vector table only prevents the paired chips from being paired in the future. The basic algorithm for generating permute vectors insures establishing the relationship of each of the previously paired chips at row locations which will not cause uncorrectable errors based on data contained in the error map.

While the invention has been particularly shown and described with reference to a preferred embodiment thereof, it will be understood by those skilled in the art that various changes in the form and details may be made therein without departing from the spirit and scope of the invention. For example, if the data steering logic operates by shifting the location of the array chips relative to the buffer positions by an amount indicated by each column's permute vector (effectively a module-16 addition for the A arrays and for the B arrays), then the forbidden results entered in FIG. 4 must reflect the arithmetic differences between the pairs of permute vectors used to produce them.

Alternatively, a separate fault map recording all known single chip faults and a separate algorithm for processing it could be avoided entirely by making entries only in the forbidden result table for each pair of known single chip faults which would align if placed in the same row of chips. The procedure of FIG. 3 could be extended to produce the complete sequence of permute vectors for all columns of chips in the memory, rather than just for one of the columns involved in the most recent unexpected alignment.

In circumstances where many faults accumulate in the memory, (such as caused by very high chip failure rate or by an inability to replace faulty chips), it may not be possible to reduce the number of aligned faults to zero, but only to minimize the number of addresses containing aligned faults. In such cases another column may be added to the table of FIG. 4 to reflect the impact (in terms of number of addresses containing aligned faults) of violating each forbidden result. The procedure of FIG. 3 could then be modified to find a permutation minimizing the number of addresses containing aligned faults rather than attempting the impossible task of reducing that number to zero.

Having thus described my invention, what I claim as new and desire to secure by Letters Patent is:

1. In a memory system which employs permute vectors for each column of the memory array to selectively rearrange within the columns the logical order of individual memory chips so as to permit a pair of chips containing defective bit positions at the same address to be relatively repositioned so that said same address contains only one defective bit position, a method for generating a new permute vector for one of said columns, said method being characterized by:
   (1) generating a result vector by combining the two initial permute vectors associated with the two columns containing chips having defects which contributed to the unexpected uncorrectable error, said result vector representing a constant relationship between the permute vectors assigned to said two columns when said chips are aligned in the same row of said matrix;
   (2) storing said result vector with paired column identification data;
   (3) developing a new permute vector for one of said two columns to rearrange the order of said chips in said one column;
   (4) combining said new permute vector with the current permute vector of each said other column which is listed in said table as paired with said one column to produce a new result vector for each said pair;
   (5) comparing each said new result vector with each stored result vector associated with correspondingly paired columns and, depending on the result of said comparison:
      (a) returning to step 3; or
      (b) assigning said new permute vector to said column for future use in said memory system.

2. The method recited in claim 1 in which said step of generating said result vector by combining the two permute vectors and said combining of step 4 involves an exclusive-OR logical operation.

3. The method recited in claim 1 in which said step of generating said result vector by combining the two permute vectors and said combining of step 4 involves a subtraction of the value of the said two permute vectors.

4. The method recited in claim 1 in which said step of storing said result vector establishes a table in memory which is cumulative.

5. The method recited in claim 4 in which said step of developing new permute vectors for one of said columns involves developing a new permute vector for the other column when the results of step 5a causes a return to step 3 until all possible combinations specified in step 4 have been exhausted.

6. The method recited in claim 5 further characterized by the step of updating an error map stored in a memory which reflects defective bit positions in said memory.

7. The method recited in claim 6 in which the normal operation of said memory in storing user data is momentarily interrupted to generate a new permute vector in response to the memory system providing an indication that an uncorrectable error has occurred at an address position and is further characterized by the additional step of rearranging user stored data in said one column to which the newly developed permute vector is assigned prior to returning said memory to an online operation.

* * * * *